United States Patent
Moise et al.

(10) Patent No.: US 6,534,348 B1
(45) Date of Patent: Mar. 18, 2003

(54) ULTRASCALED MIS TRANSISTORS FABRICATED USING SILICON-ON-LATTICE-MATCHED INSULATOR APPROACH

(75) Inventors: Theodore S. Moise, Dallas, TX (US); Glen D. Wilk, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/292,063

(22) Filed: Apr. 14, 1999

Related U.S. Application Data

(60) Provisional application No. 60/081,716, filed on Apr. 14, 1998.

(51) Int. Cl.[7] .............................................. H01L 21/00

(52) U.S. Cl. ........................ 438/158; 438/305; 438/574; 257/72

(58) Field of Search ................................ 438/158, 305, 438/574; 257/72

(56) References Cited

U.S. PATENT DOCUMENTS

| | | | |
|---|---|---|---|
| 5,229,332 A | | 7/1993 | Cho ............................ 437/235 |
| 5,229,333 A | | 7/1993 | Cho ............................ 437/235 |
| 5,530,266 A | * | 6/1996 | Yonehara et al. ............. 257/72 |
| 5,827,769 A | * | 10/1998 | Aminzadeh et al. ......... 438/305 |
| 6,077,761 A | * | 6/2000 | Chen et al. ................. 438/574 |

OTHER PUBLICATIONS

Suemasu, Takashi et al. Theoretical and Measured Characteristics of Metal ($CoSi_2$)–Insulator ($CaF_2$) Resonant Tunneling Transistors and the Influence of Parasitic Elements. IEEE Transactions on Electron Devices. vol. 42 No. 12. Dec. 1995, pp. 2203–2210.

* cited by examiner

*Primary Examiner*—Michael S. Lebentritt
*Assistant Examiner*—Pho M. Luu
(74) *Attorney, Agent, or Firm*—W. Daniel Swayze, Jr.; W. James Brady; Frederick J. Telecky, Jr.

(57) ABSTRACT

A method of fabricating a transistor using silicon on lattice matched insulator. A first monocrystalline silicon layer is provided and a first layer of dielectric is epitaxially deposited over the first silicon layer substantially lattice matched with the first silicon layer and substantially monocrystalline. A first electrically conductive gate electrode is epitaxially formed over the first layer of dielectric substantially lattice matched with the first layer of dielectric. A second layer of dielectric is epitaxially deposited conformally over the first gate electrode and exposed portions of first layer of dielectric substantially lattice matched with the first silicon layer and substantially monocrystalline. A second monocrystalline silicon layer is epitaxially deposited over the second layer of dielectric and a third layer of dielectric is epitaxially deposited over the second silicon layer substantially lattice matched with the first silicon layer and substantially monocrystalline. A second electrically conductive gate electrode is epitaxially deposited and formed over the third layer of dielectric which is substantially lattice matched with the first silicon layer and the first layer of dielectric. Source and drain regions are formed in the second silicon layer.

18 Claims, 2 Drawing Sheets

ULTRASCALED MIS TRANSISTORS FABRICATED USING SILICON-ON-LATTICE-MATCHED INSULATOR APPROACH

This application claims priority under 35 USC §119(e)(1) of U.S. provisional application No. 60/081,716 filed Apr. 14, 1998.

BACKGROUND OF THE INVENTION

1. Field of the Invention

This invention relates to a method of fabricating MIS transistors and well as plural such transistors in a stacked relation.

2. Brief Description of the Prior Art

The continued downscaling of transistor geometries is limited by the drain-induced barrier lowering (DIBL) effect wherein, as the channel becomes increasingly thinner or shorter, the isolation between the drain and the source decreases, this leading to unacceptably high off-currents. Prior art attempts at avoiding this effect have utilized double gate or wrap-around transistors which minimize DIBL effects. However, the fabrication process for these transistors is very complex because of the very thin conduction layers and gate dielectric layer which are required, these layers having thicknesses on the order of 20 nanometers and 3 nanometers, respectively.

SUMMARY OF THE INVENTION

The above described problem of the prior art is minimized in accordance with the present invention.

Briefly, an MIS transistor is provided having a double gate using an entirely epitaxial approach. By using this epitaxial approach, the channel, gate dielectric and gate layers can be deposited with atomic layer control wherein the silicon and dielectric layers are of uniform thickness to avoid problems which may be caused by having breakdown from gate electrode to channel due to regions of insufficient gate dielectric thickness. Examples of lattice-matched materials include silicon, cobalt silicide for the gate and calcium fluoride ($CaF_2$), cerium oxide ($CeO_2$) or calcium strontium titanate ($Ca_xSr_{1-x}TiO_3$) for the dielectric. In addition, since the gate dielectric is lattice-matched to silicon, epitaxial deposition of silicon thereover is single crystal rather than amorphous.

A fabrication process for a semiconductor device in accordance with the present invention includes providing a layer of single crystal silicon having a predetermined crystallographic orientation, the preferred embodiment having a (111) crystallographic orientation. This layer will act to provide substantially single crystal growth thereover and can be a substrate or an epitaxially deposited layer. The surface of the silicon is then cleaned in standard manner and a layer of a dielectric material which is lattice matched or substantially lattice matched to the silicon, preferably calcium fluoride ($CaF_2$), cerium oxide ($CeO_2$) or calcium strontium titanate ($Ca_xSr_{1-x}TiO_3$), is epitaxially deposited over the silicon, and for the case of $CaF_2$, this layer being deposited at a rate of from about 10 to about 30 Angstroms per minute at a temperature of from about 550 to about 700 degrees C. to a thickness of from about 30 to about 100 Angstroms. At higher deposition rates for $CaF_2$, the atoms of the dielectric have difficulty rearranging themiselves and therefore provide an inferior quality dielectric layer. At higher temperatures, the quality of the interface deteriorates whereas at lower temperatures the activity is too slow whereby the atoms again have difficulty rearranging themselves to provide a monocrystalline structure. A layer of electrically conductive material which is a first gate electrode is also lattice matched or substantially lattice matched to the silicon layer and dielectric layer, the gate electrode being preferably cobalt silicide ($CoSi_2$). The cobalt silicide is epitaxially deposited over the dielectric layer by depositing about 300 Angstroms of silicon at about 500 degrees C., followed by about 150 Angstroms of cobalt at about 100 degrees C. at a rate of about 10 Angstroms per minute. The cobalt silicide layer is then formed by annealing the wafer or sample at about 500 degrees C. for from about 10 to 30 minutes. This two step process forms a flat and uniform $CoSi_2$ layer. The electrically conductive gate electrode material is then patterned and etched in standard manner to provide a gate structure and a further layer of dielectric material having a thickness of from about 30 to about 100 Angstroms is conformally deposited epitaxially under different conditions from the prior layer of dielectric material. To avoid undesirable reaction between the $CoSi_2$ and overlying $CaF_2$, the $CaF_2$ should be deposited at a temperature of about 500 to 550 degrees C. (preferred), or by an ion beam deposition method, whereby separate ions of Ca and F are accelerated at the substrate at temperatures below 500 degrees C. This dielectric layer, preferably calcium fluoride, which is the first gate dielectric, is epitaxially deposited over the surface of the device being fabricated, the thickness being not so great that the lattice matching with the layers thereunder is not materially altered so that a layer of silicon having the same crystallographic structure as the initial layer of silicon can then be epitaxially deposited over the calcium fluoride and not so thin as to allow leakage from gate electrode to channel. A further layer of silicon, which will also be single crystal, is then epitaxially deposited over the first gate structure and the layers of dielectric and conductive material are repeated to provide the second gate structure and complete fabrication of the transistor.

Additional layers of silicon followed by layers of dielectric and conductive material as described above can then be epitaxially deposited to maintain the single crystal structure in a vertical direction one or more times to provide any number of stacked transistors, one atop the other, if more than one transistor is required. These additional transistors can be controlled by the gate structures on one or both sides thereof.

The source and drain regions for each of the above described embodiments are formed by etching away a portion of the dielectric layer and then forming the source and drain regions by patterning and implanting dopant on opposite sides of the gate structure and into the silicon layer under the gate structure in standard manner.

As alternative embodiments, the source and drain regions can extend to additional silicon layers and therefore form the source and drain of plural transistors, each controlled by its own gate electrode. The current-drive capabilities of such a vertically-integrated, multiple-gate transistor may have applications in high-speed, high density circuits. In addition, the source and drain structures can be raised by patterning and etching down to a silicon layer and then epitaxially depositing doped silicon or silicon which is later doped over the exposed silicon. The height of the source and drain regions is determined solely by the length and rate of deposition.

DESCRIPTION OF THE PREFERRED EMBODIMENT

Figure 1A:
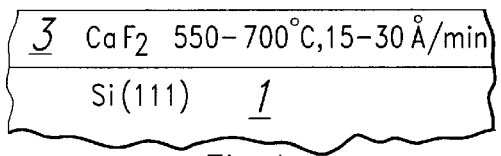
FIGS. 1a to 1i depict a process flow for fabrication of a semiconductor device in accordance with the present invention.
Figure 1B:
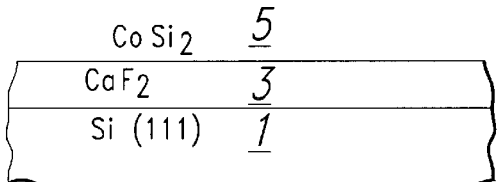
Figure 1C:
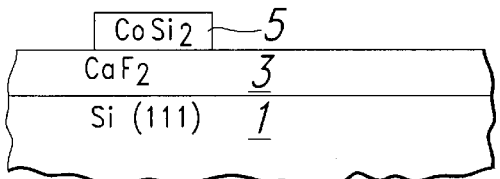
Figure 1D:
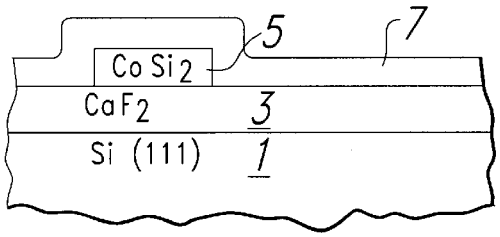
Figure 1E:
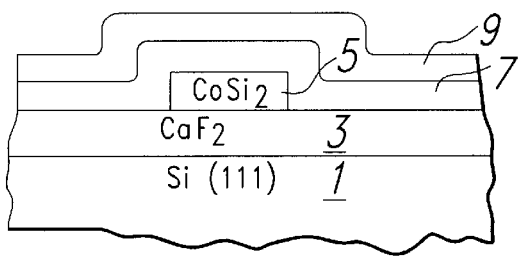
Figure 1F:
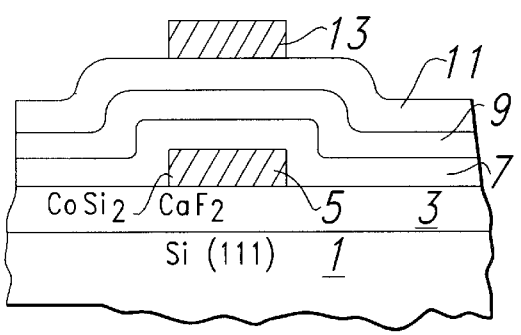

Referring to FIGS. 1a to 1i, there is shown a process flow for fabrication of a semiconductor device in accordance with the present invention. Referring first to FIG. 1a, there is provided a layer of single crystal silicon 1 having a (111) crystallographic orientation over which the transistor structure will be fabricated. This layer can be a substrate or an epitaxially deposited layer. The surface of the silicon is then cleaned in standard manner and a layer of calcium fluoride 3 which is lattice matched or substantially lattice matched to the silicon is epitaxially deposited over the silicon, this layer being deposited at a rate of about 20 Angstroms per minute at a temperature of about 600 degrees C. to a thickness of about 50 Angstroms. A layer of electrically conductive cobalt silicide 5 which is also lattice matched or substantially lattice matched to the silicon layer 1 is epitaxially deposited over the dielectric layer 3 by depositing about 300 Angstroms of silicon at 500 degrees C. followed by 150 Angstroms of cobalt at 100 degrees C. at a rate of 10 Angstroms per minute. The cobalt silicide layer is then formed by annealing the wafer or sample at about 500 degrees C. for from about 10 to 30 minutes. This two-step process forms a flat and uniform $CoSi_2$ layer as shown in FIG. 1b. The cobalt silicide 5 is then patterned and etched in standard manner to provide a gate structure as shown in FIG. 1c. A further layer of calcium fluoride 7 having a thickness of about 50 Angstroms is deposited epitaxially at about 500 to about 550 degrees C. and at a rate of from about 10 to about 30 Angstroms per minute conformally over the surface of the device being fabricated as shown in FIG. 1d, the thickness being such that the lattice matching with the layers thereunder is not materially altered so that a layer of silicon 9 having the same crystallographic structure as the initial layer of silicon can then be epitaxially deposited over the calcium fluoride 7 as shown in FIG. 1e. A further layer of calcium fluoride 11, the same as layer 7 followed by a further layer of cobalt silicide 13, the same as layer 5 are then epitaxially deposited with the cobalt silicide being patterned and etched in standard manner to form a second gate electrode as shown in FIG. 1f.

Figure 1G:
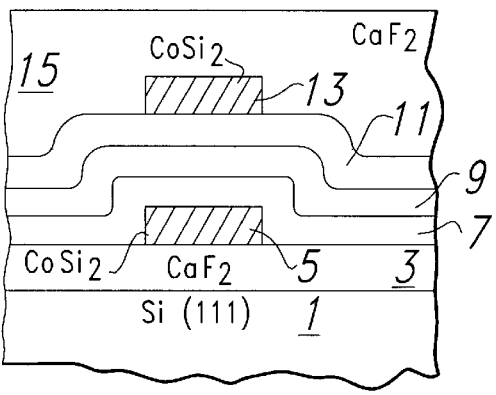
Figure 1H:
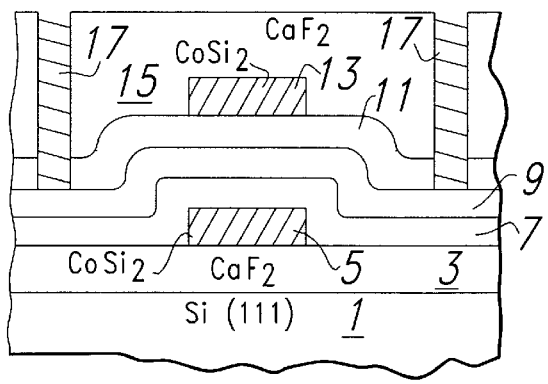
Figure 1I:
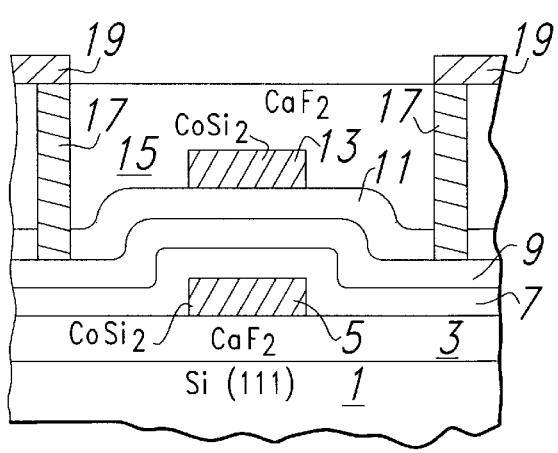

To form the source and drain regions of the transistor, a layer of calcium fluoride approximately 500 to 5000 Angstroms thick is epitaxially deposited over the entire wafer to form layer 15, under the same conditions as in layer 11. This layer is then planarized using CMP or an equivalent technique to yield a flat, uniform surface, as shown in FIG. 1g. Advanced lithography methods are then used to mask, pattern and etch aligned holes (vias) on both sides of the cobalt silicide gate layer 13. The holes are etched through layer 15, and stop at silicon layer 9. To form the source and drain regions, a poly-silicon (or $CoSi_2$) layer 17 is deposited by CVD, or an equivalent technique, in the holes formed through layer 15. The source and drain layers 17 can be heavily doped (for the case of poly-silicon) to standard levels by in situ doping (during poly-Si deposition) or by a post-deposition ion implantation step, as shown in FIG. 1h.

Figure 1J:
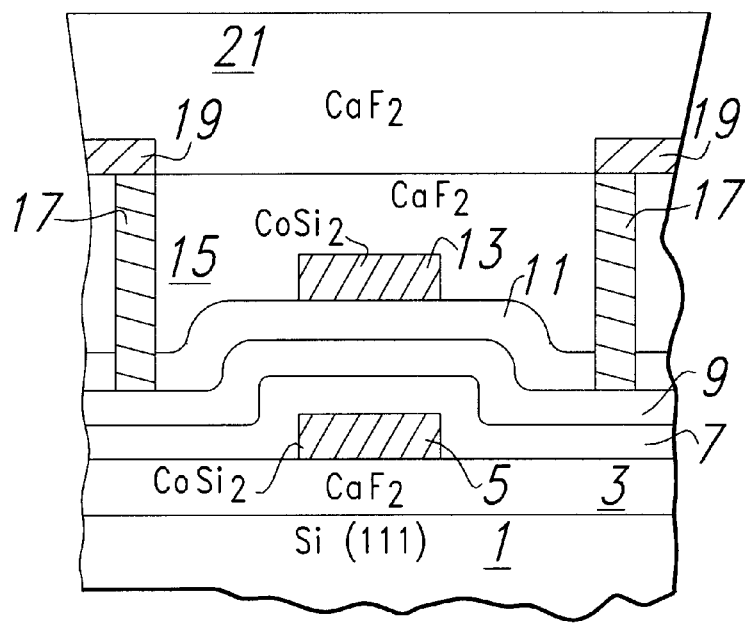
FIGS. 1j to 1k depicts the process flow of FIGS. 1a to 1i with additional processing to form a plural transistor stack in accordance with the present invention.
Figure 1K:
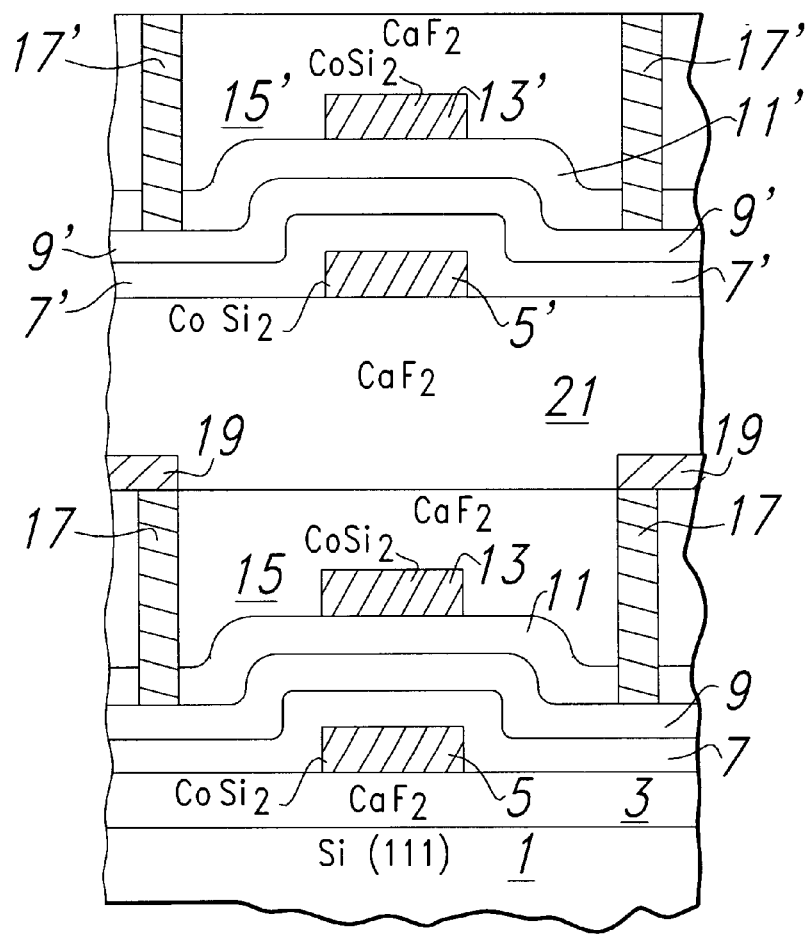

The sample is then cleaned and any residual photoresist is removed by standard cleaning procedures. To form the metal interconnect layers, advanced lithography is used to mask and pattern the surface such that $CoSi_2$ interconnect layer 19 can be deposited in the same manner described previously, as shown in FIG. 1i. To form additional transistors in a 3-dimensional fashion (i.e. directly above the existing transistor), a thick layer of $CaF_2$ 500–5000 Angstroms thick is deposited in the same manner as described previously and planarized layer 21, as shown in FIG. 1j. The processing steps for forming layers 5 through 19 are then repeated, to form a structure (e.g. with two transistors) shown in FIG. 1k.

As alternative embodiments, the source and drain regions can extend to additional silicon layers and therefore form the source and drain of plural transistors, each controlled by its own gate electrode. In addition, the source and drain structures can be raised by patterning and etching down to a silicon layer and then epitaxially depositing doped silicon or silicon which is later doped over the exposed silicon as shown in FIG. 1g.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of fabricating a transistor which comprises the steps of:
   (a) providing a first monocrystalline silicon layer;
   (b) epitaxially depositing a first layer of dielectric over said first silicon layer which is substantially lattice matched with said first silicon layer and substantially monocrystalline;
   (c) epitaxially depositing and forming a first electrically conductive gate electrode over said first layer of dielectric which is substantially lattice matched with said first silicon layer and said first layer of dielectric;
   (d) epitaxially depositing a second layer of dielectric conformally over said first gate electrode and exposed portions of said first layer of dielectric which is substantially lattice matched with said first silicon layer and substantially monocrystalline;
   (e) epitaxially depositing a second monocrystalline silicon layer over said second layer of dielectric;
   (f) epitaxially depositing a third layer of dielectric over said second silicon layer which is substantially lattice matched with said first silicon layer and substantially monocrystalline;
   (g) epitaxially depositing and forming a second electrically conductive gate electrode over said third layer of dielectric which is substantially lattice matched with said first silicon layer and said first layer of dielectric; and
   (h) forming source and drain regions in said second silicon layer,
   wherein said first and second monocrystalline silicon layers have a (111) crystallographic orientation.

2. The method of claim 1 wherein each said dielectric is taken from the class consisting of calcium fluoride, cerium oxide and calcium strontium titanate.

3. The method of claim 2 wherein each said electrode is cobalt silicide.

4. The method of claim 3 wherein said step of epitaxially depositing said dielectric material comprises deposition at a rate of from about 15 to about 30 Angstroms per minute at a temperature of from about 550 to about 700 degrees C. with a thickness of from about 30 to about 100 Angstroms.

5. The method of claim 2 wherein said step of epitaxially depositing said dielectric material comprises deposition at a rate of from about 15 to about 30 Angstroms per minute at a temperature of from about 550 to about 700 degrees C. with a thickness of from about 30 to about 100 Angstroms.

6. The method of claim 1 wherein each said electrode is cobalt silicide.

7. The method of claim 2 wherein said step of epitaxially depositing said dielectric material comprises deposition at a rate of from about 15 to about 30 Angstroms per minute at a temperature of from about 550 to about 700 degrees C. with a thickness of from about 30 to about 100 Angstroms.

8. The method of claim 1 wherein said step of epitaxially depositing said dielectric material comprises deposition at a rate of from about 15 to about 30 Angstroms per minute at a temperature of from about 550 to about 700 degrees C. with a thickness of from about 30 to about 100 Angstroms.

9. A method of fabricating a transistor which comprises the steps of:
   (a) providing a first monocrystalline silicon layer;
   (b) epitaxially depositing a first layer of dielectric over said first silicon layer which is substantially lattice matched with said first silicon layer and substantially monocrystalline;
   (c) epitaxially depositing and forming a first electrically conductive gate electrode over said first layer of dielectric which is substantially lattice matched with said first silicon layer and said first layer of dielectric;
   (d) epitaxially depositing a second layer of dielectric conformally over said first gate electrode and exposed portions of said first layer of dielectric which is substantially lattice matched with said first silicon layer and substantially monocrystalline;
   (e) epitaxially depositing a second monocrystalline silicon layer over said second layer of dielectric;
   (f) epitaxially depositing a third layer of dielectric over said second silicon layer which is substantially lattice matched with said first silicon layer and substantially monocrystalline;
   (g) epitaxially depositing and forming a second electrically conductive gate electrode over said third layer of dielectric which is substantially lattice matched with said first silicon layer and said first layer of dielectric; and
   (h) forming source and drain regions in said second silicon layer,
      wherein each said dielectric is taken from the class consisting of calcium fluoride, cerium oxide and calcium strontium titanate.

10. The method of claim 9 wherein each said electrode is cobalt silicide.

11. The method of claim 10 wherein said step of epitaxially depositing said dielectric material comprises deposition at a rate of from about 15 to about 30 Angstroms per minute at a temperature of from about 550 to about 700 degrees C. with a thickness of from about 30 to about 100 Angstroms.

12. The method of claim 8 wherein said step of epitaxially depositing said dielectric material comprises deposition at a rate of from about 15 to about 30 Angstroms per minute at a temperature of from about 550 to about 700 degrees C. with a thickness of from about 30 to about 100 Angstroms.

13. A method of fabricating a transistor which comprises the steps of:
   (a) providing a first monocrystalline silicon layer;
   (b) epitaxially depositing a first layer of dielectric over said first silicon layer which is substantially lattice matched with said first silicon layer and substantially monocrystalline;
   (c) epitaxially depositing and forming a first electrically conductive gate electrode over said first layer of dielectric which is substantially lattice matched with said first silicon layer and said first layer of dielectric;
   (d) epitaxially depositing a second layer of dielectric conformally over said first gate electrode and exposed portions of said first layer of dielectric which is substantially lattice matched with said first silicon layer and substantially monocrystalline;
   (e) epitaxially depositing a second monocrystalline silicon layer over said second layer of dielectric;
   (f) epitaxially depositing a third layer of dielectric over said second silicon layer which is substantially lattice matched with said first silicon layer and substantially monocrystalline;
   (g) epitaxially depositing and forming a second electrically conductive gate electrode over said third layer of dielectric which is substantially lattice matched with said first silicon layer and said first layer of dielectric; and
   (h) forming source and drain regions in said second silicon layer,
      wherein each said electrode is cobalt silicide.

14. The method of claim 13 wherein said step of epitaxially depositing said dielectric material comprises deposition at a rate of from about 15 to about 30 Angstroms per minute at a temperature of from about 550 to about 700 degrees C. with a thickness of from about 30 to about 100 Angstroms.

15. A method of fabricating a transistor which comprises the steps of:
   (a) providing a first monocrystalline silicon layer;
   (b) epitaxially depositing a first layer of dielectric over said first silicon layer which is substantially lattice matched with said first silicon layer and substantially monocrystalline;
   (c) epitaxially depositing and forming a first electrically conductive gate electrode over said first layer of dielectric which is substantially lattice matched with said first silicon layer and said first layer of dielectric;
   (d) epitaxially depositing a second layer of dielectric conformally over said first gate electrode and exposed portions of said first layer of dielectric which is substantially lattice matched with said first silicon layer and substantially monocrystalline;
   (e) epitaxially depositing a second monocrystalline silicon layer over said second layer of dielectric;
   (f) epitaxially depositing a third layer of dielectric over said second silicon layer which is substantially lattice matched with said first silicon layer and substantially monocrystalline;
   (g) epitaxially depositing and forming a second electrically conductive gate electrode over said third layer of dielectric which is substantially lattice matched with said first silicon layer and said first layer of dielectric; and
   (h) forming source and drain regions in said second silicon layer,
      wherein said step of epitaxially depositing said dielectric material comprises deposition at a rate of from about 15 to about 30 Angstroms per minute at a temperature of from about 550 to about 700 degrees C. with a thickness of from about 30 to about 100 Angstroms.

16. A method of fabricating a transistor stack which comprises the steps of:

(a) providing a first monocrystalline silicon layer;

(b) epitaxially depositing a first layer of dielectric over said first silicon layer which is substantially lattice matched with said first silicon layer and substantially monocrystalline;

(c) epitaxially depositing and forming a first electrically conductive gate electrode over said first layer of dielectric which is substantially lattice matched with said first silicon layer and said first layer of dielectric;

(d) epitaxially depositing a second layer of dielectric conformally over said first gate electrode and exposed portions of said first layer of dielectric which is substantially lattice matched with said first silicon layer and substantially monocrystalline;

(e) epitaxially depositing a second monocrystalline silicon layer over said second layer of dielectric;

(f) epitaxially depositing a third layer of dielectric over said second silicon layer which is substantially lattice matched with said first silicon layer and substantially monocrystalline;

(g) epitaxially depositing and forming a second electrically conductive gate electrode over said third layer of dielectric which is substantially lattice matched with said first silicon layer and said first layer of dielectric;

(h) forming source and drain regions in said second silicon layer to provide a first transistor;

(i) epitaxially depositing a fourth layer of dielectric over said first transistor; and (j) repeating steps (c) to (h) over said fourth layer of dielectric, wherein said monocrystalline silicon layers have a (111) crystallographic orientation.

17. A method of fabricating a transistor stack which comprises the steps of:

(a) providing a first monocrystalline silicon layer;

(b) epitaxially depositing a first layer of dielectric over said first silicon layer which is substantially lattice matched with said first silicon layer and substantially monocrystalline;

(c) epitaxially depositing and forming a first electrically conductive gate electrode over said first layer of dielectric which is substantially lattice matched with said first silicon layer and said first layer of dielectric;

(d) epitaxially depositing a second layer of dielectric conformally over said first gate electrode and exposed portions of said first layer of dielectric which is substantially lattice matched with said first silicon layer and substantially monocrystalline;

(e) epitaxially depositing a second monocrystalline silicon layer over said second layer of dielectric;

(f) epitaxially depositing a third layer of dielectric over said second silicon layer which is substantially lattice matched with said first silicon layer and substantially monocrystalline;

(g) epitaxially depositing and forming a second electrically conductive gate electrode over said third layer of dielectric which is substantially lattice matched with said first silicon layer and said first layer of dielectric;

(h) forming source and drain regions in said second silicon layer to provide a first transistor;

(i) epitaxially depositing a fourth layer of dielectric over said first transistor; and (j) repeating steps (c) to (h) over said fourth layer of dielectric, wherein each said dielectric is taken from the class consisting of calcium fluoride, cerium oxide and calcium strontium titanate.

18. A method of fabricating a transistor stack which comprises the steps of:

(a) providing a first monocrystalline silicon layer;

(b) epitaxially depositing a first layer of dielectric over said first silicon layer which is substantially lattice matched with said first silicon layer and substantially monocrystalline;

(c) epitaxially depositing and forming a first electrically conductive gate electrode over said first layer of dielectric which is substantially lattice matched with said first silicon layer and said first layer of dielectric;

(d) epitaxially depositing a second layer of dielectric conformally over said first gate electrode and exposed portions of said first layer of dielectric which is substantially lattice matched with said first silicon layer and substantially monocrystalline;

(e) epitaxially depositing a second monocrystalline silicon layer over said second layer of dielectric;

(f) epitaxially depositing a third layer of dielectric over said second silicon layer which is substantially lattice matched with said first silicon layer and substantially monocrystalline;

(g) epitaxially depositing and forming a second electrically conductive gate electrode over said third layer of dielectric which is substantially lattice matched with said first silicon layer and said first layer of dielectric;

(h) forming source and drain regions in said second silicon layer to provide a first transistor;

(i) epitaxially depositing a fourth layer of dielectric over said first transistor; and (j) repeating steps (c) to (h) over said fourth layer of dielectric, wherein each said dielectric is taken from the class consisting of calcium fluoride, cerium oxide and calcium strontium titanate.

* * * * *